(12) United States Patent
Okuno (10) Patent No.: US 6,450,469 B1
(45) Date of Patent: Sep. 17, 2002

(54) FLAT PANEL DISPLAY OR PROBE BLOCK SUPPORT FRAMEWORK

(75) Inventor: Toshio Okuno, Kanagawa-ken (JP)

(73) Assignees: Soshotech Co., Ltd, Kanagawa-ken (JP); Adtec Engineering Co., Ltd., Tokyo (JP)

( * ) Notice: Subject to any disclaimer, the term of this patent is extended or adjusted under 35 U.S.C. 154(b) by 0 days.

(21) Appl. No.: 09/566,010

(22) Filed: May 5, 2000

(30) Foreign Application Priority Data

Aug. 31, 1999 (JP) .......................................... 11-245104

(51) Int. Cl.⁷ .............................................. A47B 91/00
(52) U.S. Cl. ............................. 248/346.01; 248/346.07; 248/287.1
(58) Field of Search ........................ 248/346.01, 346.03, 248/346.07, 346.3, 309.1, 477, 297.21, 298.1, 287.1

(56) References Cited

U.S. PATENT DOCUMENTS

| | | | | |
|---|---|---|---|---|
| 3,612,508 A | * | 10/1971 | Rise | 269/203 |
| 5,003,254 A | * | 3/1991 | Hunt et al. | 324/158 |
| 5,954,106 A | * | 9/1999 | Huang | 144/286.5 |
| 6,150,833 A | * | 11/2000 | Lin et al. | 345/144 |

* cited by examiner

Primary Examiner—Leslie A. Braun
Assistant Examiner—A. Joseph Wujciak (74) *Attorney, Agent, or Firm*—Wenderoth, Lind & Ponack, L.L.P.

(57) ABSTRACT

A rectangular support framework for a flat panel display as an object to be tested or a testing probe block is disclosed. The rectangular support framework comprises an upper cross frame plate which is capable of moving vertically alone with respect to a right vertical frame plate and which is capable of moving vertically in association with vertical movement of a left vertical frame plate, a lower cross frame plate which is capable of moving vertically alone with respect to the left vertical frame plate and which is capable of moving vertically in association with vertical movement of the right vertical frame plate, the left vertical frame plate which is capable of moving laterally alone with respect to the upper cross frame plate and which is capable of moving laterally in association with lateral movement of the lower cross frame plate, and the right vertical frame plate which is capable of moving laterally alone with respect to the lower cross frame plate and which is capable of moving laterally in association with lateral movement of the upper cross frame plate. The vertical movement and lateral movement of the upper and lower cross frame plates and left and right vertical frame plates enlarge or reduce a window which is defined by the upper and lower cross frame plates and left and right vertical frame plates. The flat panel display or the testing probe block which is subjected to pressure contact with electrode pads arranged on a peripheral edge portion of the flat panel display is supported on the upper and lower cross frame plates and left and right vertical frame plates which defined the enlarged or reduced window.

6 Claims, 3 Drawing Sheets

FLAT PANEL DISPLAY OR PROBE BLOCK SUPPORT FRAMEWORK

BACKGROUND OF THE INVENTION

1. Field of the Invention

This invention relates to a support framework for a flat panel display as represented by a liquid crystal panel which is an object to be tested, or it relates to a support framework for a testing probe block which is subjected to pressure contact with electrode pads which are arranged on a peripheral edge portion of the flat panel display.

2. Related Art

Figures 6A, 6B:
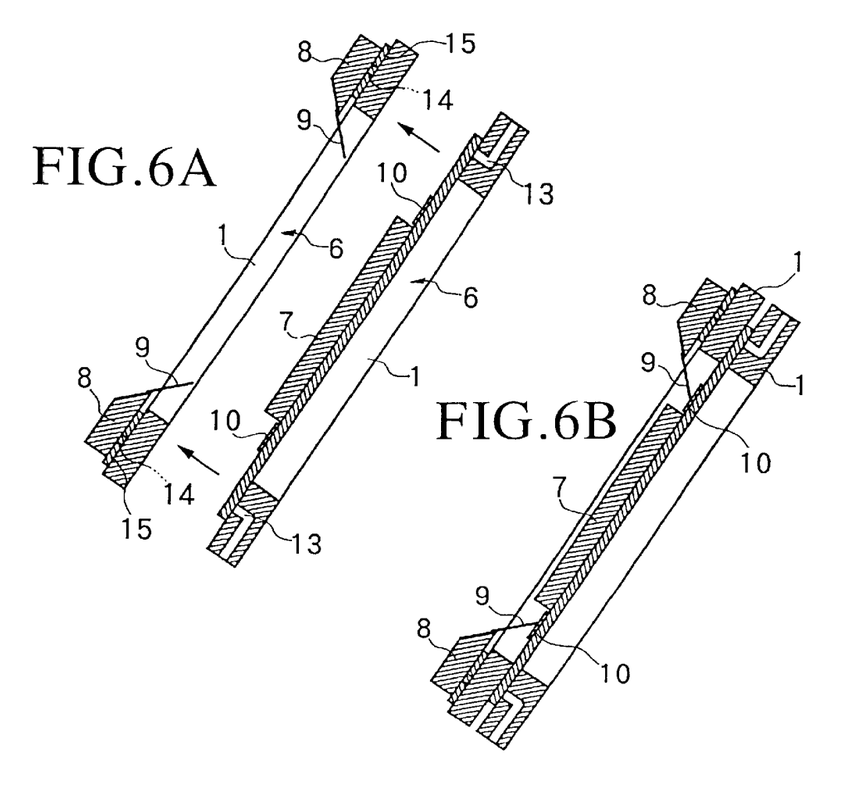

The flat panel display support framework and testing probe block support framework are fabricated of a rectangular framework. As shown in FIGS. 6(A) and 6(B), a front rectangular framework 1, on which testing probe blocks 8 are supported, is disposed on a front side of a rear rectangular framework 1, on which a flat panel display 7 as represented by a liquid crystal is supported. The rear rectangular framework 1 is reciprocally movably disposed on the front rectangular framework 1. The arrangement is such that when the rear rectangular framework 1 is advanced, testing probes 9 of the testing probe blocks 8 are pressure contacted with corresponding electrode pads 10 which are arranged on a peripheral edge portion of the flat panel display 7. When the rear rectangular framework 1 is retracted, replacement of the flat panel display 7 is performed.

It is ordinary practice in the prior art that a rear and a front framework are prepared for each of the flat panel displays which have difference sizes, and a testing probe block is supported thereon.

This is inconvenient, indeed, because it is necessary to prepare a test device having proper front and rear frameworks for each of the flat panel displays which have different sizes. Otherwise, it is necessary to design only the front and rear frameworks replaceable in accordance with the sizes of the flat panel displays. This naturally results in not only increased expenses in installation of the device but also inefficiency of testing operation carried out by a worker(s) who is required to replace heavy frameworks.

SUMMARY OF THE INVENTION

It is, therefore, a general object of the present invention to provide a flat panel display support framework or a probe block support framework which can amicably solve the above-mentioned inconveniences which the conventional devices had.

A specific object of the present invention is to provide a flat panel display support framework or a probe block support framework which can appropriately cope with flat panel displays having different sizes in a single test device.

In order to achieve the above objects, there is essentially provided in a first embodiment of the present invention a rectangular support framework for a flat panel display as an object to be tested or a testing probe block. The rectangular support framework comprises an upper cross frame plate which is capable of moving vertically alone with respect to a right vertical frame plate and which is capable of moving vertically in association with vertical movement of a left vertical frame plate, a lower cross frame plate which is capable of moving vertically alone with respect to the left vertical frame plate and which is capable of moving vertically in association with vertical movement of the right vertical frame plate, the left vertical frame plate which is capable of moving laterally alone with respect to the upper cross frame plate and which is capable of moving laterally in association with lateral movement of the lower cross frame plate, and the right vertical frame plate which is capable of moving laterally alone with respect to the lower cross frame plate and which is capable of moving laterally in association with the lateral movement of the upper cross frame plate. The vertical movement and lateral movement of the upper cross frame plates and left and right vertical frame plates enlarge or reduce a window which is defined by the upper and lower cross frame plates and left and right vertical frame plates. The flat panel display or the probe block which is subjected to pressure contact with electrode pads arranged on a peripheral edge portion of the flat panel display is supported on the upper and lower cross frame plates and left and right vertical frame plates which define the enlarged or reduced window.

In the first embodiment, the upper cross frame plate and the right vertical frame plate are connected such that the upper cross frame plate is capable of moving vertically alone and the upper cross frame plate and right vertical frame plate are capable of moving laterally in association with each other, the left vertical frame plate and the upper cross frame plate are connected such that the left vertical frame plate is capable of moving laterally alone and the left vertical frame plate and upper cross frame plate are capable of moving vertically in association with each other, the lower cross frame plate and the left vertical frame plate are connected such that the lower cross frame plate is capable of moving vertically alone and the lower cross frame plate and left vertical frame plate are capable of moving laterally in association with each other, and the right vertical frame plate and the lower cross are connected such that the right vertical frame plate is capable of moving laterally alone and the right vertical frame plate and lower cross frame plate are capable of moving vertically in association with each other.

In a second embodiment of the present invention, there is provided a rectangular support framework for a flat panel display as an object to be tested or a testing probe block. The rectangular support framework comprises an upper cross frame plate which is capable of moving vertically alone with respect to a left vertical frame plate and which is capable of moving vertically in association with vertical movement of a right vertical frame plate, a lower cross frame plate which is capable of moving vertically alone with respect to the right vertical frame plate and which is capable of moving vertically in association with vertical movement of the left vertical frame plate, the left vertical frame plate which is capable of moving laterally alone with respect to the lower cross frame plate and which is capable of moving laterally in association with lateral movement of the upper cross frame plate, and the right vertical frame plate which is capable of moving laterally alone with respect to the upper cross frame plate and which is capable of moving laterally in association with lateral movement of the lower cross frame. The vertical movement and lateral movement of the upper and lower cross frame plates and left and right vertical frame plates enlarge or reduce a window which is defined by the upper and lower cross frame plates and left and right vertical frame plates. The flat panel display or the probe block which is subjected to pressure contact with electrode pads arranged on a peripheral edge portion of the flat panel display is supported on the upper and lower cross frame plates and left and right vertical frame plates which define the enlarged or reduced window.

In the second embodiment the upper cross frame plate and the left vertical frame plate are connected such that the upper cross frame plate is capable of moving vertically alone and the upper cross frame plate and left vertical frame plate are capable of moving laterally in association with each other, the right vertical frame plate and the upper cross frame plate are connected such that the right vertical frame plate is capable of moving laterally alone and the right vertical frame plate and upper cross frame plate are capable of moving vertically in association with each other, the lower cross frame plate and the right vertical frame plate are connected such that the lower cross frame plate is capable of moving vertically alone and the lower cross frame plate and right vertical frame plate are capable of moving laterally in association with each other, and the left vertical frame plate and the lower cross frame plate are connected such that the left vertical frame plate is capable of moving laterally alone and the left vertical frame plate and lower cross frame plate are capable of moving vertically in association with each other.

The several features and advantages of the present invention will become more apparent to those skilled in the art by reference to the detailed description which follows taken in conjunction with the several figures of the drawing.

BRIEF DESCRIPTION OF THE DRAWINGS

FIGS. 6(A) and 6(B) are sectional views showing a testing device fabricated of a first rectangular framework on which probe blocks are supported and a second rectangular framework on which a flat panel display is supported, wherein FIG. 6(A) shows a before contacted state and FIG. 6(B) shows an after contacted state.

DETAILED DESCRIPTION OF THE EMBODIMENTS

Embodiments of the present invention will now be described with reference to FIGS. 1(A) to 7.

<First Embodiment> (see FIGS. 1(A), 1(B), 6(A), 6(B) and 7)

Figure 1A:
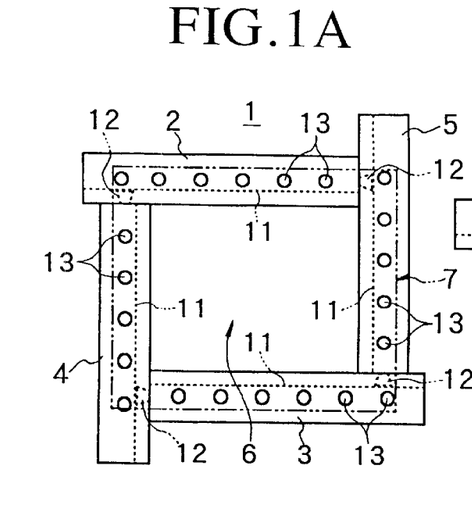
FIG. 1(A) is front view showing, in an enlarged window configuration, a support framework for a flat display according to one embodiment of the present invention
Figure 1B:
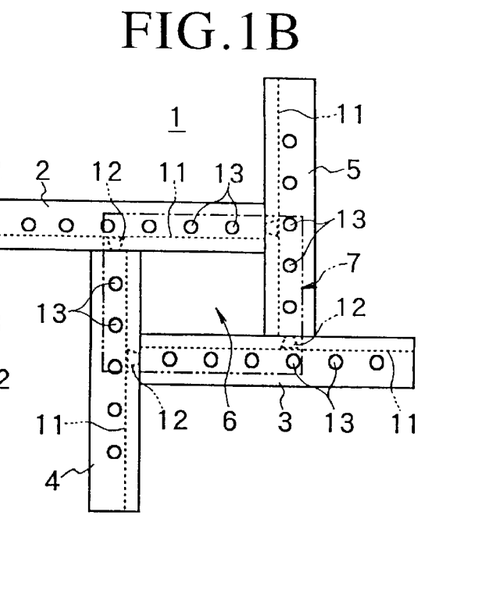
FIG. 1(B) is likewise a front view showing, in a reduced window configuration, the support framework for a flat panel display of FIG. 1(A)

Reference numeral 1 generally denotes a rectangular support framework for supporting a flat panel display 7 as represented by a liquid crystal panel which is an object to be tested.

The rectangular support framework 1 is comprised of an upper cross frame plate 2 which is capable of moving vertically alone with respect to a right vertical frame plate 5 and which is capable of moving vertically in association with vertical movement of a left vertical frame plate 4, a lower cross frame plate 3 which is capable of moving vertically alone with respect to the left vertical frame plate 4 and which is capable of moving vertically in association with vertical movement of the right vertical frame plate 5, the left vertical frame plate 4 which is capable of moving laterally alone with respect to the upper cross frame plate 2 and which is capable of moving laterally in association with lateral movement of the lower cross frame plate 3, and the right vertical frame plate 5 which is capable of moving laterally alone with respect to the lower cross frame plate 3 and which is capable of moving laterally in association with lateral movement of the upper cross frame plate 2.

The vertical movement and lateral movement of the upper and lower cross frame plates 2, 3 and left and right vertical frame plates 4, 5 enlarge or reduce a window 6 which is defined by the upper and lower cross frame plates 2, 3 and left and right vertical frame plates 4, 5. The flat panel display 7 is supported on the upper and lower cross frame plates 2, 3 and left and right vertical frame plates 4, 5 which define the enlarged or reduced window 6.

The upper cross frame plate 2 and the right vertical frame plate 5 are connected such that the upper cross frame plate 2 is capable of moving vertically alone and the upper cross frame plate 2 and right vertical frame plate 5 are capable of moving laterally in association with each other.

Similarly, the left vertical frame plate 4 and the upper cross frame plate 2 are connected such that the left vertical frame plate 4 is capable of moving laterally alone and the left vertical frame plate 4 and upper cross frame plate 2 are capable of moving vertically in association with each other. The lower cross frame plate 3 and the left vertical frame plate 4 are connected such that the lower cross frame plate 3 is capable of moving vertically alone and the lower cross frame plate 3 and left vertical frame plate 4 are capable of moving laterally in association with each other. The right vertical frame plate 5 and the lower cross frame plate 3 are connected such that the right vertical frame plate 5 is capable of moving laterally alone and the right vertical frame plate 5 and lower cross frame plate 3 are capable of moving vertically in association with each other.

Figure 7:
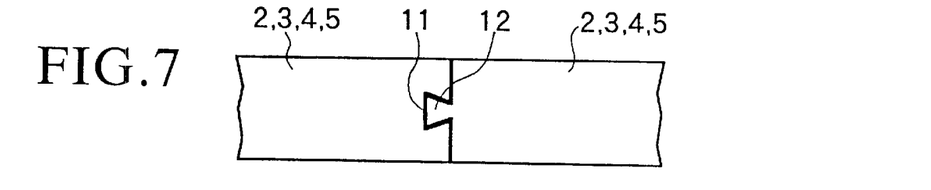
FIG. 7 is an enlarged sectional view showing a connecting mechanism of frame plates.

The above connecting mechanism is shown, for example, in FIG. 7. As shown in FIG. 7, one end of the upper cross frame plate 2 is abutted with an inner surface of the right vertical frame plate 5. Similarly, one end of the left vertical frame plate 4 is abutted with an inner surface of the upper cross frame plate 2. One end of the lower cross frame plate 3 is abutted with an inner surface of the left vertical frame plate 4. One end of the right vertical frame plate 5 is abutted with an inner surface of the lower cross frame plate 3. And the above connecting mechanism is provided at each abutment portion.

As one specific example of the connecting mechanism, a wedge-shaped guide groove 11 is formed in and along an inner surface of each of the upper and lower cross frame plates 2, 3 and left and right vertical frame plates 4, 5 in such a manner as to open at the inner surface. On the other hand, that end of each of the frame plates 2, 3, 4, 5 which is abutted with this inner surface is formed with a wedge-shaped tab 12 which is key connected to the guide groove 11. The tab 12 is slidingly engaged (key connection) in the guide groove 11.

By virtue of the above connection, the upper cross frame plate 2 is capable of moving vertically alone with respect to the right vertical frame plate 5 and it is capable of moving laterally together with the right vertical frame plate 5.

Similarly, the left vertical frame plate 4 is capable of moving laterally alone with respect to the upper cross frame plate 2 and it is capable of moving vertically together with the upper lateral frame plate 5. The lower cross frame plate 3 is capable of moving vertically alone with respect to the left vertical frame plate 4 and it is capable of moving laterally together with the left vertical frame plate 4. The right vertical frame plate 5 is capable of moving laterally alone with respect to the lower lateral frame plate 3 and it is capable of moving vertically together with the lower cross frame plate 3. Thus, the window 6 is enlarged and reduced.

Each of the frame plates 2, 3, 4, 5 has suction holes 13 which are arranged on an outer surface thereof generally over the entire length. Those suction holes 13 are connected to a suction device. By means of those suction holes 13, a peripheral edge portion of the flat panel display 7 is suckingly supported on those outer surfaces of the upper and lower cross frame plates 2, 3 and those outer surfaces of the left and right vertical frame plates 4, 5 which define the enlarged or reduced window 6.

As shown in FIGS. 6(A) and 6(B), each probe block 8 has a plurality of probes 9 whose distal ends are pressure contacted with the outer surfaces of the electrode pads 10.

Either of the support framework 1 for the flat panel display 7 and the support framework 1 for the testing probe block 8 is fabricated of a rectangular framework. The front rectangular framework 1 on which the testing probe block 8 is supported is disposed on a front surface side of the rear rectangular framework 1 on which the flat panel display 7 as represented by a liquid crystal panel is supported. The rear rectangular framework 1 is reciprocally movably disposed on the front rectangular framework 1 such that when the rear rectangular framework 1 advances, the testing probes 9 of the testing probe blocks 8 are pressure contacted with the electrode pads 10 which are arranged on the peripheral edge portion of the flat panel display 7 and when the rear rectangular framework 1 retracts, the displacement of the flat panel display 7 is performed.

The window 6 of the front rectangular framework 1 is enlarged and the replacement of the flat panel display 7 is performed onto the rear rectangular framework 1 from the front of the front rectangular framework 1 through the enlarged window 6. In this case, it is not necessary for the rear rectangular framework 1 to be disposed reciprocally movably.

<Second Embodiment> (see FIGS. 2(A), 2(B), and 5 to 7)

Figure 2A:
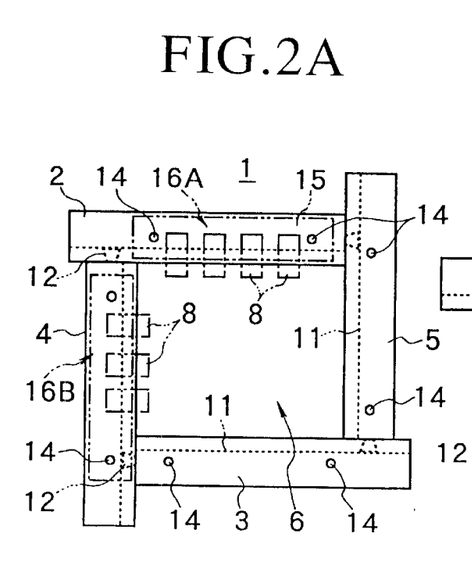
FIG. 2(A) is a front view showing, in an enlarged window configuration, a support framework for a probe block according to one embodiment of the present invention
Figure 2B:
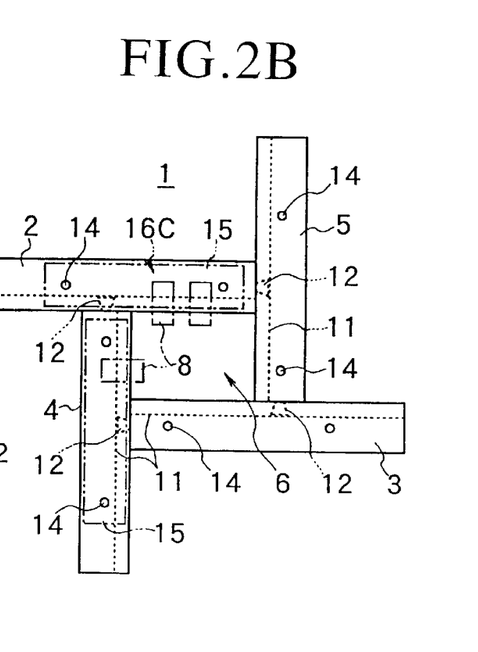
FIG. 2(B) is likewise a front view showing, in a reduced window configuration, the support framework for a probe block of FIG. 2(A)

Reference numeral 1 generally denotes a rectangular support framework for supporting a testing probe block 8.

The rectangular support framework 1 is comprised of an upper cross frame plate 2 which is capable of moving vertically alone with respect to a right vertical frame plate 5 and which is capable of moving vertically in association with vertical movement of a left vertical frame plate 4, a lower cross frame plate 3 which is capable of moving vertically alone with respect to the left vertical frame plate 4 and which is capable of moving vertically in association with vertical movement of the right vertical frame plate 5, the left vertical frame plate 4 which is capable of moving laterally alone with respect to the upper cross frame plate 2 and which is capable of moving laterally in association with lateral movement of the lower cross frame plate 3, and the right vertical frame plate 5 which is capable of moving laterally alone with respect to the lower cross frame plate 3 and which is capable of moving laterally in association with lateral movement of the upper cross frame plate 2.

The vertical movement and lateral movement of the upper and lower cross frame plates 2, 3 and left and right vertical frame plates 4, 5 enlarge or reduce a window 6 which is defined by the upper and lower cross frame plates 2, 3 and left and right vertical frame plates 4, 5. The probe block 8 is supported on the upper and lower cross frame plates 2, 3 and left and right vertical frame plates 4, 5 which define the enlarged or reduced window 6.

As shown in FIGS. 6(A) and 6(B), each probe block 8 has a plurality of probes 9 whose distal ends are pressure contacted with the outer surfaces of the electrode pads 10.

The upper cross frame plate 2 and the right vertical frame plate 5 are connected such that the upper cross frame plate 2 is capable of moving vertically alone and the upper cross frame plate 2 and right vertical frame plate 5 are capable of moving laterally in association with each other.

Similarly, the left vertical frame plate 4 and the upper cross frame plate 2 are connected such that the left vertical frame plate 4 is capable of moving laterally alone and the left vertical frame plate 4 and upper cross frame plate 2 are capable of moving vertically in association with each other. The lower cross frame plate 3 and the left vertical frame plate 4 are connected such that the lower cross frame plate 3 is capable of moving vertically alone and the lower cross frame plate 3 and left vertical frame plate 4 are capable of moving laterally in association with each other. The right vertical frame plate 5 and the lower cross frame plate 3 are connected such that the right vertical frame plate 5 is capable of moving laterally alone and the right vertical frame plate 5 and lower cross frame plate 3 are capable of moving vertically in association with each other.

The above connecting mechanism is shown, for example, in FIG. 7. As shown in FIG. 7, one end of the upper cross frame plate 2 is abutted with an inner surface of the right vertical frame plate 5. Similarly, one end of the left vertical frame plate 4 is abutted with an inner surface of the upper cross frame plate 2. One end of the lower cross frame plate 3 is abutted with an inner surface of the left vertical frame plate 4. One end of the right vertical frame plate 5 is abutted with an inner surface of the lower cross frame plate 3. And the above connecting mechanism is provided at each abutment portion.

As one specific example of the connecting mechanism, a wedge-shaped guide groove 11 is formed in and along an inner surface of each of the upper and lower cross frame plates 2, 3 and left and right vertical frame plates 4, 5 in such a manner as to open at the inner surface. On the other hand, that end of each of the frame plates 2, 3, 4, 5 which is abutted with this inner surface is formed with a wedge-shaped tab 12 which is key connected to the guide groove 11. The tab 12 is slidingly engaged (key connection) in the guide groove 11.

By virtue of the above connection, the upper cross frame plate 2 is capable of moving vertically alone with respect to the right vertical frame plate 5 and it is capable of moving laterally together with the right vertical frame plate 5.

Similarly, the left vertical frame plate 4 is capable of moving laterally alone with respect to the upper cross frame plate 2 and it is capable of moving vertically together with the upper cross frame plate 2. The lower cross frame plate 3 is capable of moving vertically alone with respect to the left vertical frame plate 4 and it is capable of moving laterally together with the left vertical frame plate 4. The right vertical frame plate 5 is capable of moving laterally alone with respect to the lower lateral frame plate 3 and it is capable of moving vertically together with the lower cross frame plate 3. Thus, the window 6 is enlarged and reduced.

Each of the frame plates 2, 3, 4, 5 is equal in length. Each of those frame plates 2, 3, 4, 5 having the equal length is provided at opposite ends of an outer surface thereof with equally spacedly arranged positioning pins or holes 14.

Figure 5:
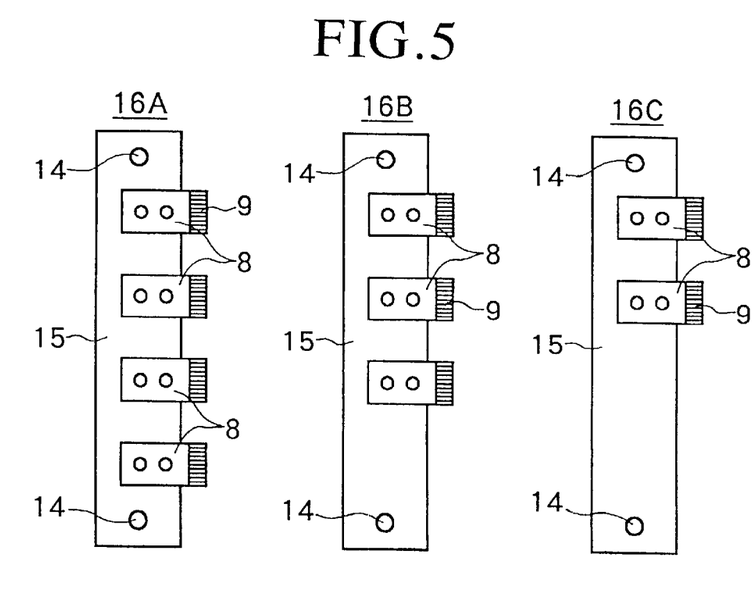
FIG. 5 is a plan view showing three examples of probe units.

On the other hand, as shown in FIG. 5, probe units 16A, 16B, 16C are prepared, which are provided with a plurality of probe blocks 8 removably attached to bases 15 having an equal length and serving as holders of the probe blocks 8 at locations corresponding to the sides of the enlarged or reduced window 6.

Those probe units 16A, 16B, 16C are properly selected in accordance with the enlarged or reduced window 6 and inserted in the positioning pins or holes 14 of the frame plates 2, 3, 4, 5 so that the units 16A, 16B, 16C are integrally removably attached thereto. Thus, the probe blocks 8 are supportingly attached to the frame plates 2, 3, 4, 5 through the bases which serve as holders.

As shown in FIGS. 6(A) and 6(B), either of the support framework 1 for the flat panel display 7 and the support framework 1 for the testing probe block 8 is fabricated of a rectangular framework. The front rectangular framework 1 on which the testing probe block 8 is supported is disposed on a front surface side of the rear rectangular framework 1 on which the flat panel display 7 as represented by a liquid crystal panel is supported. The rear rectangular framework 1 is reciprocally movably disposed on the front rectangular framework 1 such that when the rear rectangular framework 1 advances, the testing probes 9 of the testing probe blocks 8 are pressure contacted with the electrode pads 10 which are arranged on the peripheral edge portion of the flat panel display 7 and when the rear rectangular framework I retracts, the displacement of the flat panel display 7 is performed.

The window 6 of the front rectangular framework 1 is enlarged and the replacement of the flat panel display 7 is performed onto the rear rectangular framework 1 from the front of the front rectangular framework 1 through the enlarged window 6. In this case, it is not necessary for the rear rectangular framework 1 to be disposed reciprocally movably.

<Third Embodiment> (see FIGS. 3(A), 3(B), 6(A), 6(B) and 7)

Figure 3A:
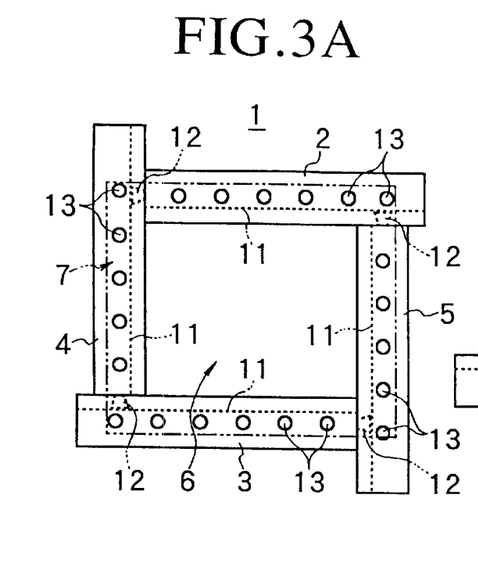
FIG. 3(A) is a front view showing, in an enlarged window configuration, a support framework for a flat panel display according to another embodiment of the present invention
Figure 3B:
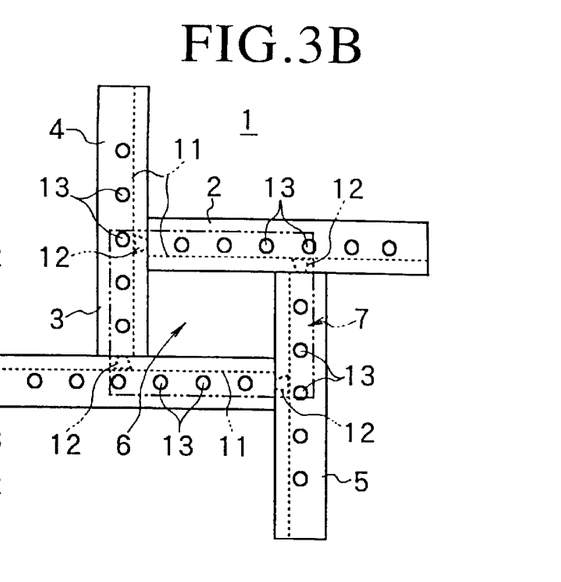
FIG. 3(B) is likewise a front view showing, in a reduced window configuration, the support framework for a flat panel display of FIG. 3(A)

Reference numeral 1 generally denotes a rectangular support framework for supporting a flat panel display 7 as represented by a liquid crystal panel which is an object to be tested.

The rectangular support framework 1 is comprised of an upper cross frame plate 2 which is capable of moving vertically alone with respect to a left vertical frame plate 4 and which is capable of moving vertically in association with vertical movement of a right vertical frame plate 5, a lower cross frame plate 3 which is capable of moving vertically alone with respect to the right vertical frame plate 5 and which is capable of moving vertically in association with vertical movement of the left vertical frame plate 4, the left vertical frame plate 4 which is capable of moving laterally alone with respect to the lower cross frame plate 3 and which is capable of moving laterally in association with lateral movement of the upper cross frame plate 2, and the right vertical frame plate 5 which is capable of moving laterally alone with respect to the upper cross frame plate 2 and which is capable of moving laterally in association with lateral movement of the lower cross frame plate 3.

The vertical movement and lateral movement of the upper and lower cross frame plates 2, 3 and left and right vertical frame plates 4, 5 enlarge or reduce a window 6 which is defined by the upper and lower cross frame plates 2, 3 and left and right vertical frame plates 4, 5. The flat panel display 7 is supported on the upper and lower cross frame plates 2, 3 and left and right vertical frame plates 4, 5 which defined the enlarged or reduced window 6.

The upper cross frame plate 2 and the left vertical frame plate 4 are connected such that the upper cross frame plate 2 is capable of moving vertically alone and the upper cross frame plate 2 and left vertical frame plate 4 are capable of moving laterally in association with each other.

Similarly, the right vertical frame plate 5 and the upper cross frame plate 2 are connected such that the right vertical frame plate 5 is capable of moving laterally alone and the right vertical frame plate 5 and upper cross frame plate 2 are capable of moving vertically in association with each other. The lower cross frame plate 3 and the right vertical frame plate 5 are connected such that the lower cross frame plate 3 is capable of moving vertically alone and the lower cross frame plate 3 and right vertical frame plate 5 are capable of moving laterally in association with each other. The left vertical frame plate 4 and the lower cross frame plate 3 are connected such that the left vertical frame plate 4 is capable of moving laterally alone and the left vertical frame plate 4 and lower cross frame plate 3 are capable of moving vertically in association with each other.

The above connecting mechanism is shown, for example, in FIG. 7. As shown in FIG. 7, one end of the upper cross frame plate 2 is abutted with an inner surface of the left vertical frame plate 4. Similarly, one end of the left vertical frame plate 4 is abutted with an inner surface of the lower cross frame plate 3. One end of the lower cross frame plate 3 is abutted with an inner surface of the right vertical frame plate 5. One end of the right vertical frame plate 5 is abutted with an inner surface of the upper cross frame plate 2. And the above connecting mechanism is provided at each abutment portion.

As one specific example of the connecting mechanism, a wedge-shaped guide groove 11 is formed in and along an inner surface of each of the upper and lower cross frame plates 2, 3 and left and right vertical frame plates 4, 5 in such a manner as to open at the inner surface. On the other hand, that end of each of the frame plates 2, 3, 4, 5 which is abutted with this inner surface is formed with a wedge-shaped tab 12 which is key connected to the guide groove 11. The tab 12 is slidingly engaged (key connection) in the guide groove 11.

By virtue of the above connection, the upper cross frame plate 2 is capable of moving vertically alone with respect to the left vertical frame plate 4 and it is capable of moving laterally together with the left vertical frame plate 4.

Similarly, the left vertical frame plate 4 is capable of moving laterally alone with respect to the lower cross frame plate 3 and it is capable of moving vertically together with the lower cross frame plate 3. The lower cross frame plate 3 is capable of moving vertically alone with respect to the right vertical frame plate 5 and it is capable of moving laterally together with the right vertical frame plate 5. The right vertical frame plate 5 is capable of moving laterally alone with respect to the upper cross frame plate 2 and it is capable of moving vertically together with the upper cross frame plate 2. Thus, the window 6 is enlarged and reduced.

Each of the frame plates 2, 3, 4, 5 has suction holes 13 which are arranged on an outer surface thereof generally over the entire length. Those suction holes 13 are connected to a suction device. By means of those suction holes 13, a peripheral edge portion of the flat panel display 7 is suckingly supported on those outer surfaces of the upper and lower cross frame plates 2, 3 and those outer surfaces of the left and right vertical frame plates 4, 5 which define the enlarged or reduced window 6.

As shown in FIGS. 6(A) and 6(B), each probe blocks 8 has a plurality of probes 9 whose distal ends are pressure contacted with the outer surfaces of the electrodes pads 10.

Either of the support framework 1 for the flat panel display 7 and the support framework 1 for the testing probe block 8 is fabricated of a rectangular framework. The front rectangular framework 1 on which the testing probe block 8 is supported is disposed on a front surface side of the rear rectangular framework 1 on which the flat panel display 7 as represented by a liquid crystal panel is supported. The rear rectangular framework 1 is reciprocally movably disposed on the front rectangular framework 1 such that when the rear rectangular framework 1 advances, the testing probes 9 of the testing probe blocks 8 are pressure contacted with the electrode pads 10 which are arranged on the peripheral edge portion of the flat panel display 7 and when the rear rectangular framework 1 retracts, the displacement of the flat panel display 7 is performed.

The window 6 of the front rectangular framework 1 is enlarged and the replacement of the flat panel display 7 is performed onto the rear rectangular framework 1 from the front of the front rectangular framework 1 through the enlarged window 6. In this case, it is not necessary for the rear rectangular framework 1 to be disposed reciprocally movably.

<Fourth Embodiment> (see FIGS. 4(A), 4(B), and 5 to 7)

Figure 4A:
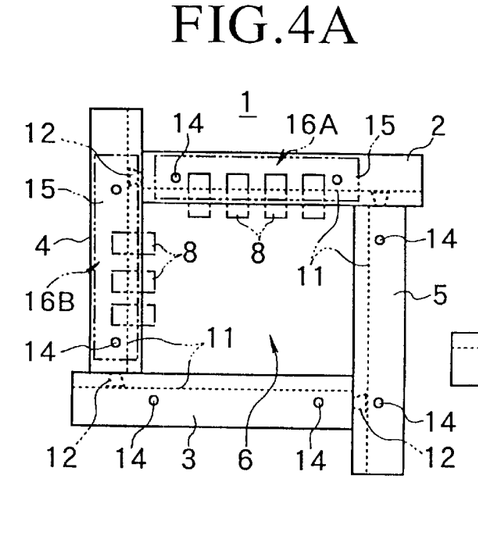
FIG. 4(A) is a front view showing, in an enlarged window configuration, a support framework for a probe block according to another embodiment of the present invention
Figure 4B:
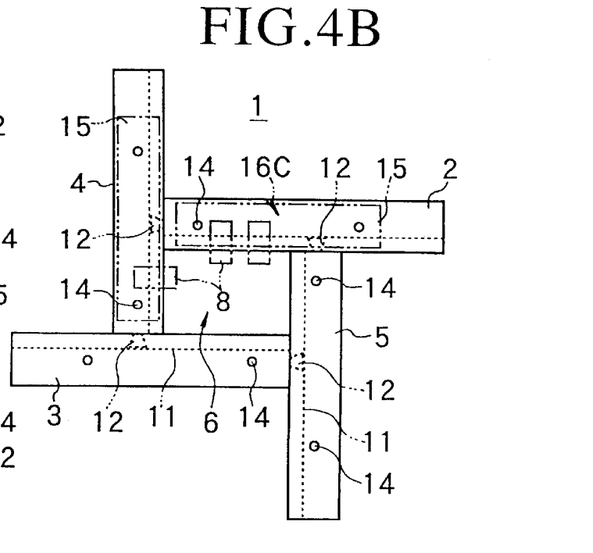
FIG. 4(B) is likewise a front view showing, in a reduced window configuration, the support framework for a probe block of FIG. 4(A)

Reference numeral 1 generally denotes a rectangular support framework for supporting a testing probe block 8.

The rectangular support framework 1 is comprised of an upper cross frame plate 2 which is capable of moving vertically alone with respect to a left vertical frame plate 4 and which is capable of moving vertically in association with vertical movement of a right vertical frame plate 5, a lower cross frame plate 3 which is capable of moving vertically alone with respect to the right vertical frame plate 5 and which is capable of moving vertically in association with vertical movement of the left vertical frame plate 4, the left vertical frame plate 4 which is capable of moving laterally alone with respect to the lower cross frame plate 3 and which is capable of moving laterally in association with lateral movement of the upper cross frame plate 2, and the right vertical frame plate 5 which is capable of moving laterally alone with respect to the upper cross frame plate 2 and which is capable of moving laterally in association with lateral movement of the lower cross frame plate 3.

The vertical movement and lateral movement of the upper and lower cross frame plates 2, 3 and left and right vertical frame plates 4, 5 enlarge or reduce a window 6 which is defined by the upper and lower cross frame plates 2, 3 and left and right vertical frame plates 4, 5. The probe block 8, which is pressure contacted with a plurality of a electrode pads 10 arranged on a peripheral edge portion of the flat panel displace 7, is supported on the upper and lower cross frame plates 2, 3 and left and right vertical frame plates 4, 5 which defines the enlarged or reduced window 6.

As shown in FIGS. 6(A) and 6(B), each probe block 8 has a plurality of probes 9 whose distal ends are pressure contacted with the outer surfaces of the electrode pads 10.

The upper cross frame plate 2 and the left vertical frame plate 4 are connected such that the upper cross frame plate 2 is capable of moving vertically alone and the upper cross frame plate 2 and the left vertical frame plate 4 are capable of moving laterally in association with each other.

Similarly, the right vertical frame plate 5 and the upper cross frame plate 2 are connected such that the right vertical frame plate 5 is capable of moving laterally alone and the right vertical frame plate 5 and upper cross frame plate 2 are capable of moving vertically in association with each other. The lower cross frame plate 3 and the right vertical frame plate 5 are connected such that the lower cross frame plate 3 is capable of moving vertically alone and the lower cross frame plate 3 and right vertical frame plate 5 are capable of moving laterally in association with each other. The left vertical frame plate 4 and the lower cross frame plate 3 are connected such that the left vertical frame plate 4 is capable of moving laterally alone and the left vertical frame plate 4 and lower cross frame plate 3 are capable of moving vertically in association with each other.

The above connecting mechanism is shown, for example, in FIG. 7. As shown in FIG. 7, one end of the upper cross frame plate 2 is abutted with an inner surface of the left vertical frame plate 4. Similarly, one end of the left vertical frame plate 4 is abutted with an inner surface of the lower cross frame plate 3. One end of the lower cross frame plate 3 is abutted with an inner surface of the right vertical frame plate 5. One end of the right vertical frame plate 5 is abutted with an inner surface of the upper cross frame plate 2. And the above connecting mechanism is provided at each abutment portion.

As one specific example of the connecting mechanism, a wedge-shaped guide groove 11 is formed in and along an inner surface of each of the upper and lower cross frame plates 2, 3 and left and right vertical frame plates 4, 5 in such a manner as to open at the inner surface. On the other hand, that end of each of the frame plates 2, 3, 4, 5 which is abutted with this inner surface is formed with a wedge-shaped tab 12 which is key connected to the guide groove 11. The tab 12 is slidingly engaged (key connection) in the guide groove 11.

By virtue of the above connection, the upper cross frame plate 2 is capable of moving vertically alone with respect to the left vertical frame plate 4 and it is capable of moving laterally together with the left vertical frame plate 4.

Similarly, the left vertical frame plate 4 is capable of moving laterally alone with respect to the lower cross frame plate 3 and it is capable of moving vertically together with the lower cross frame plate 3. The lower cross frame plate 3 is capable of moving vertically alone with respect to the right vertical frame plate 5 and it is capable of moving laterally together with the right vertical frame plate 5. The right vertical frame plate 5 is capable of moving laterally alone with respect to the upper cross frame plate 2 and it is capable of moving vertically together with the upper cross frame plate 2. Thus, the window 6 is enlarged and reduced.

Each of the frame plates 2, 3, 4, 5 is equal in length. Each of these frame plates 2, 3, 4, 5 having the equal length is provided at opposite ends of an outer surface thereof with equally spacedly arranged positioning pins or holes 14.

On the other hand, as shown in FIG. 5, probe units 16A, 16B, 16C are prepared, which are provided with a plurality of probe blocks 8 removably attached to bases 15 having an equal length and serving as holders of the probe blocks 8 at locations corresponding to the sides of the enlarged or reduced window 6.

Those probe units 16A, 16B, 16C are properly selected in accordance with the enlarged or reduced window 6 and placed on or inserted in the positioning pins or holes 14 of the frame plates 2, 3, 4, 5 so that the units 16A, 16B, 16C are integrally removably attached thereto. Thus, the probe blocks 8 are supportingly attached to the frame plates 2, 3, 4, 5 through the bases which serve as holders.

As shown in FIGS. 6(A) and 6(B), either of the support framework 1 for the flat panel display 7 and the support framework 1 for the testing probe block 8 is fabricated of a rectangular framework. The front rectangular framework 1 on which the testing probe block 8 is supported is disposed on a front surface side of the rear rectangular framework 1 on which the flat panel display 7 as represented by a liquid crystal panel is supported. The rear rectangular framework 1 is reciprocally movably disposed on the front rectangular framework 1 such that when the rear rectangular framework 1 advances, the testing probes 9 of the testing probe blocks 8 are pressure contacted with the electrode pads 10 which are arranged on the peripheral edge portion of the flat panel display 7 and when the rear rectangular framework 1 retracts, the displacement of the flat panel display 7 is performed.

The window 6 of the front rectangular framework 1 is enlarged and the replacement of the flat panel display 7 is performed onto the rear rectangular framework 1 from the front of the front rectangular framework 1 through the enlarged window 6. In this case, it is not necessary for the rear rectangular framework 1 to be disposed reciprocally movably.

That is to say, in the above first to fourth embodiments, the rectangular support framework 1 fabricated of the frame plates 2, 3, 4, 5 on which the flat panel display 7 is supported, is disposed on a rear surface side of the rectangular support framework 1 fabricated of the frame plates 2, 3, 4, 5 on which the testing probe block 8 is supported. An illumination means is disposed at the rear part of the window 6 of the rear surface side rectangular support framework 1 on which the flat panel display 7 is supported. The flat panel display 7 is illuminated by the illumination means through the window 6. By virtue of the foregoing arrangement, testing is performed while observing the connected state between the electrode pads 10 and the probes 9 under illumination through the window 6.

The present invention is applicable to either the rectangular support framework 1 on which the flat panel display 7 is supported or the rectangular support framework 1 on which the testing probe block 8 is supported.

According to the present invention, support frameworks having sizes corresponding to a wide variety of flat panel displays can easily be made by means of vertical or lateral movement of the upper and lower cross frame plates and the left and right vertical frame plates. Similarly, testing probe support frameworks having sizes corresponding to a wide variety of flat panel displays can easily be made. This makes it possible to apply a test device to various kinds of flat panel displays which have different sizes. Thus, the present invention is economically efficient and it can enhance efficiency of the testing operation.

While the present invention has been described in connection with preferred embodiments thereof, other modifications will become apparent to those skilled in the art upon a study of the specification, drawings and claims.

While the present invention has been described in connection with specific examples thereof, other modifications will become apparent to those skilled in the art upon a study of the specification, drawings and claims.

What is claimed is:

1. A rectangular support framework for a flat panel display as an object to be tested or a testing probe block, comprising:
   a first frame plate extending in a first direction and having an inner surface and an end portion;
   a second frame plate extending in a second direction that is transverse to the first direction and having an inner surface and an end portion;
   a third frame plate extending in a third direction that is opposite to the first direction and having an inner surface and an end portion; and
   a fourth frame plate extending in a fourth direction that is opposite to the second direction and having an inner surface and an end portion, wherein
   (i) the end portion of said first frame plate is engageable with the inner surface of said second frame plate such that when the end portion of said first frame plate is engaged with the inner surface of said second frame plate said first frame plate can move relative to said second frame plate in the second direction and can move in unison with said second frame plate in the third direction;
   (ii) the end portion of said second frame plate is engageable with the inner surface of said third frame plate such that when the end portion of said second frame plate is engaged with the inner surface of said third frame plate said second frame plate can move relative to said third frame plate in the third direction and can move in unison with said third frame plate in the fourth direction;
   (iii) the end portion of said third frame plate is engageable with the inner surface of said fourth frame plate such that when the end portion of said third frame plate is engaged with the inner surface of said fourth frame plate said third frame plate can move relative to said fourth frame plate in the fourth direction and can move in unison with said fourth frame plate in the first direction; and
   (iv) the end portion of said fourth frame plate is engageable with the inner surface of said first frame plate such that when the end portion of said fourth frame plate is engaged with the inner surface of said first frame plate said fourth frame plate can move relative to said first frame plate in the first direction and can move in unison with said first frame plate in the second direction,
   such that when the end portion of said first frame plate is engaged with the inner surface of said second frame plate, the end portion of said second frame plate is engaged with the inner surface of said third frame plate, the end portion of said third frame plate is engaged with the inner surface of said fourth frame plate, and the end portion of said fourth frame plate is engaged with the inner surface of said first frame plate an opening is defined by a combination of the inner surfaces of said first, second, third and fourth frame plates, which opening can be made one of larger and smaller as a result of
   (a) movement of said first frame plate relative to said second frame plate in the second direction and movement of said first frame plate in unison with said second frame plate in the third direction,
   (b) movement of said second frame plate relative to said third frame plate in the third direction and movement of said second frame plate in unison with said third frame plate in the fourth direction,
   (c) movement of said third frame plate relative to said fourth frame plate in the fourth direction and movement of said third frame plate in unison with said fourth frame plate in the first direction, and
   (d) movement of said fourth frame plate relative to said first frame plate in the first direction and movement of said fourth frame plate in unison with said first frame plate in the second direction,
   whereby a first flat panel display or a first probe block that is to be subjected to pressure contact with electrode pads arranged on a peripheral edge portion of the first flat panel display can be supported on said first, second, third and fourth frame plates.

2. The rectangular support framework according to claim 1, wherein when the end portion of said first frame plate is engaged with the inner surface of said second frame plate said first frame plate can also move relative to said second frame plate in the fourth direction and can also move in unison with said second frame plate in the first direction, when the end portion of said second frame plate is engaged with the inner surface of said third frame plate said second frame plate can also move relative to said third frame plate in the first direction and can also move in unison with said third frame plate in the second direction, when the end portion of said third frame plate is engaged with the inner surface of said fourth frame plate said third frame plate can also move relative to said fourth frame plate in the second direction and can also move in unison with said fourth frame plate in the third direction, and when the end portion of said fourth frame plate is engaged with the inner surface of said first frame plate said fourth frame plate can also move relative to said second frame plate in the third direction and can also move in unison with said first frame plate in the fourth direction, such that when the end portion of said first frame plate is engaged with the inner surface of said second frame plate, the end portion of said second frame plate is engaged with the inner surface of said third frame plate, the end portion of said third frame plate is engaged with the inner surface of said fourth frame plate, and the end portion of said fourth frame plate is engaged with the inner surface of said first frame plate the opening defined by the combination of the inner surfaces of said first, second, third and fourth frame plates can be made the other of larger and smaller as a result of (a) movement of said first frame plate relative to said second frame plate in the fourth direction and movement of said first frame plate in unison with said second frame plate in the first direction, (b) movement of said second frame plate relative to said third frame plate in the first direction and movement of said second frame plate in unison with said third frame plate in the second direction, (c) movement of said third frame plate relative to said fourth frame plate in the second direction and movement of said third frame plate in unison with said fourth frame plate in the third direction, and (d) movement of said fourth frame plate relative to said first frame plate in the third direction and movement of said fourth frame plate in unison with said first frame plate in the fourth direction, whereby a second flat panel display that is different in size than the first flat panel display or a second probe block that is different in size than the first probe block and is to be subjected to pressure contact with electrode pads arranged on a peripheral edge portion of the second flat panel display can be supported on said first, second, third and fourth frame plates.

3. The rectangular support framework according to claim 2, wherein the end portion of said first frame plate includes a projection and the inner surface of said second frame plate includes a groove, and the end portion of said first frame plate is engageable with the inner surface of said second frame plate by having the projection of said first frame plate be engageable with the groove of said second frame plate, the end portion of said second frame plate includes a projection and the inner surface of said third frame plate includes a groove, and the end portion of said second frame plate is engageable with the inner surface of said third frame plate by having the projection of said second frame plate be engageable with the groove of said third frame plate, the end portion of said third frame plate includes a projection and the inner surface of said fourth frame plate includes a groove, and the end portion of said third frame plate is engageable with the inner surface of said fourth frame plate by having the projection of said third frame plate be engageable with the groove of said fourth frame plate, and the end portion of said fourth frame plate includes a projection and the inner surface of said first frame plate includes a groove, and the end portion of said fourth frame plate is engageable with the inner surface of said first frame plate by having the projection of said fourth frame plate be engageable with the groove of said first frame plate.

4. The rectangular support framework according to claim 3, wherein the projection of each of said first, second, third and fourth frame plates is wedge-shaped and the groove of each of said first, second, third and fourth frame plates is correspondingly wedge-shaped.

5. The rectangular support framework according to claim 1, wherein the end portion of said first frame plate includes a projection and the inner surface of said second frame plate includes a groove, and the end portion of said first frame plate is engageable with the inner surface of said second frame plate by having the projection of said first frame plate be engageable with the groove of said second frame plate, the end portion of said second frame plate includes a projection and the inner surface of said third frame plate includes a groove, and the end portion of said second frame plate is engageable with the inner surface of said third frame plate by having the projection of said second frame plate be engageable with the groove of said third frame plate, the end portion of said third frame plate includes a projection and the inner surface of said fourth frame plate includes a groove, and the end portion of said third frame plate is engageable with the inner surface of said fourth frame plate by having the projection of said third frame plate be engageable with the groove of said fourth frame plate, and the end portion of said fourth frame plate includes a projection and the inner surface of said first frame plate includes a groove, and the end portion of said fourth frame plate is engageable with the inner surface of said first frame plate by having the projection of said fourth frame plate be engageable with the groove of said first frame plate.

6. The rectangular support framework according to claim 5, wherein the projection of each of said first, second, third and fourth frame plates is wedge-shaped and the groove of each of said first, second, third and fourth frame plates is correspondingly wedge-shaped.

* * * * *